(12) United States Patent
Pang et al.

(10) Patent No.: US 10,037,935 B1
(45) Date of Patent: Jul. 31, 2018

(54) LEAD FRAME WITH DUMMY LEADS FOR BURR MITIGATION DURING ENCAPSULATION

(71) Applicant: NXP USA, Inc., Austin, TX (US)

(72) Inventors: Xingshou Pang, Tianjin (CN); Zhigang Bai, Tianjin (CN); Jinzhong Yao, Tianjin (CN); Yuan Zang, Tianjin (CN)

(73) Assignee: NXP USA, Inc., Austin, TX (US)

( * ) Notice: Subject to any disclaimer, the term of this patent is extended or adjusted under 35 U.S.C. 154(b) by 24 days.

(21) Appl. No.: 15/499,355

(22) Filed: Apr. 27, 2017

(30) Foreign Application Priority Data

Apr. 13, 2017 (CN) .......................... 2017 1 0241884

(51) Int. Cl.
*H01L 23/495* (2006.01)
*H01L 23/31* (2006.01)
*H01L 21/48* (2006.01)
*H01L 21/56* (2006.01)

(52) U.S. Cl.
CPC .... *H01L 23/49555* (2013.01); *H01L 21/4825* (2013.01); *H01L 21/565* (2013.01); *H01L 23/3107* (2013.01); *H01L 23/49503* (2013.01)

(58) Field of Classification Search
None
See application file for complete search history.

(56) References Cited

U.S. PATENT DOCUMENTS

| | | | |
|---|---|---|---|
| 5,424,577 A | 6/1995 | Suzuki et al. | |
| 5,637,914 A | 6/1997 | Tanaka et al. | |
| 8,859,339 B2 | 10/2014 | Bai et al. | |
| 8,901,721 B1 | 12/2014 | Bai et al. | |
| 2013/0093031 A1* | 4/2013 | Gao | H01L 29/66007 257/417 |
| 2013/0196473 A1* | 8/2013 | Bai | H03K 19/018521 438/123 |

* cited by examiner

*Primary Examiner* — Eva Y Montalvo
*Assistant Examiner* — Kevin Quinto

(57) ABSTRACT

Embodiments of a lead frame for a packaged semiconductor device are provided, one embodiment including: a die pad; a first row of active lead fingers that are laterally separated from one another along their entire length; a package body perimeter that indicates placement of a package body of the packaged semiconductor device, wherein the package body perimeter is located laterally around the die pad; a first dummy lead finger positioned in parallel next to an initial active lead finger of the first row of active lead fingers, wherein the first dummy lead finger and the initial active lead finger are laterally separated from one another along their entire length, and wherein the first dummy lead finger is separated from the package body perimeter by a gap distance; and a first tie bar connected to an outside edge of the first dummy lead finger.

20 Claims, 8 Drawing Sheets

LEAD FRAME WITH DUMMY LEADS FOR BURR MITIGATION DURING ENCAPSULATION

CROSS-REFERENCE TO RELATED APPLICATIONS

This application claims priority under 35 U.S.C. § 119 U.S. to Chinese Application No. 201710241884.3 having a filing date of Apr. 13, 2017, the contents of which are incorporated by reference in its entirety.

BACKGROUND

Field

This disclosure relates generally to integrated circuit packaging, and more specifically, to packaging a lead frame-based semiconductor die package.

Related Art

A semiconductor die is a small integrated circuit (IC) formed on a semiconductor wafer, such as a silicon wafer. Such a die is typically cut from the wafer and packaged using a lead frame. The lead frame is a metal frame that supports the die and provides external electrical connections for the packaged die. The lead frame usually includes a flag (or die pad) and lead fingers (or leads). The semiconductor die is attached to the flag. Bond pads on the die are electrically connected to the leads of the lead frame with bond wires. The die and bond wires are covered with an encapsulant to form a semiconductor die package. The leads either project outwardly from the encapsulation or are at least flush with the encapsulation so they can be used as terminals, allowing the packaged die to be electrically connected to other devices or a printed circuit board (PCB).

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Figure 1:
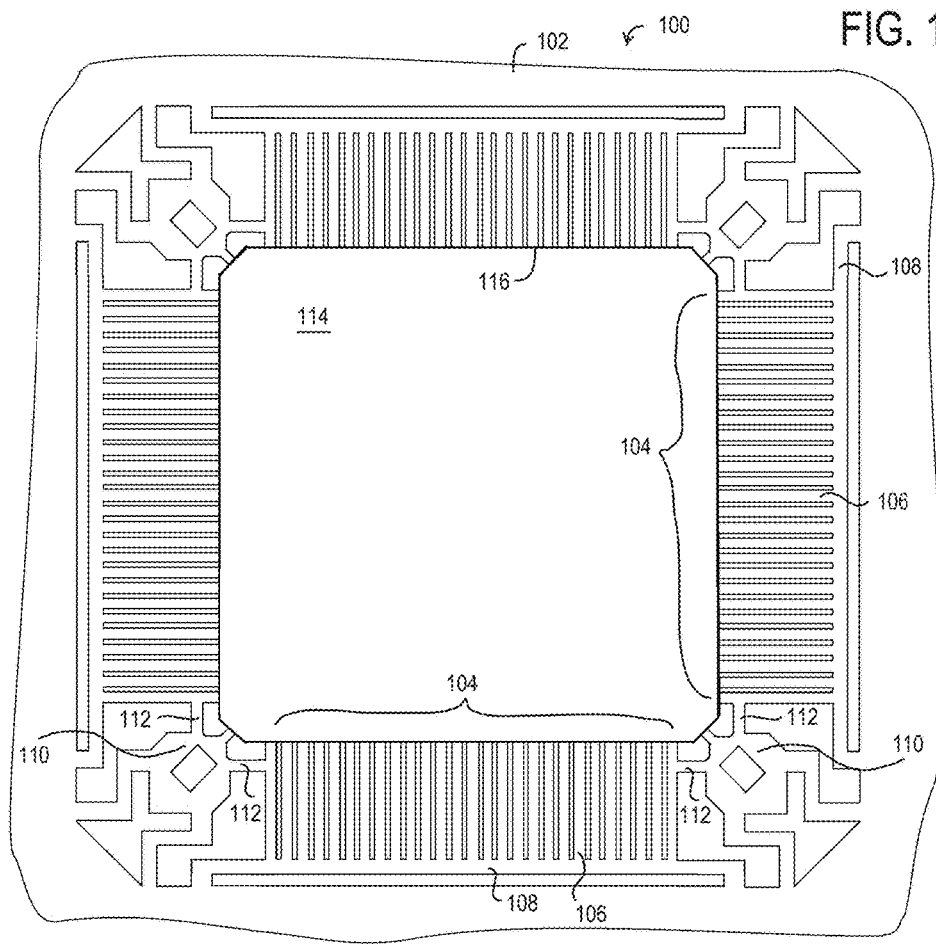
FIG. 1 illustrates a block diagram depicting a top-down view of an example semiconductor die package including a lead frame and package body.

During an encapsulation process to form a semiconductor die package on a lead frame, the leads of the lead frame may be bent into a desired shape, which are then cut or separated from the lead frame during a trim and form process. A top-down view of an example semiconductor die package 100 formed on a lead frame is shown in FIG. 1, which shows a number of active leads 104 extending from an outer edge of package body 114, also referred to as a package body outline 116. The active leads 104 are used to form external electrical connections for the semiconductor die package 100. Four rows of active leads 104 are shown extending from each side of the package body 114. Die pad connection structures 110 also extend from the corners of the package body outline 116, where the active leads 104 and the die pad connection structures 110 are attached to a surrounding frame structure 102. As shown, the frame structure 102 also includes structures to improve flexibility to avoid damaging parts of the lead frame during encapsulation and trim and form processes, such as connection bar 108 to which ends 106 of the active leads 104 are attached. The active leads 104 do not include a dam bar and are not connected to one another.

The die pad connection structures 110 are also attached to each neighboring or adjacent active lead on the rows of active leads 104 by a tie bar 112. As shown, each die pad connection structure 110 (in a corner) is connected to a neighboring active lead on a horizontal row of active leads 104 (on a first side of the package body 114) and a vertical row of active leads 104 (on a second side perpendicular to the first side of the package body 114). Put another way, each row of active leads 104 has a first active lead that is connected to a first die pad connection structure 110 (at a first corner) and a last active lead that is connected to a second die pad connection structure 110 (at a second corner).

Figure 2:
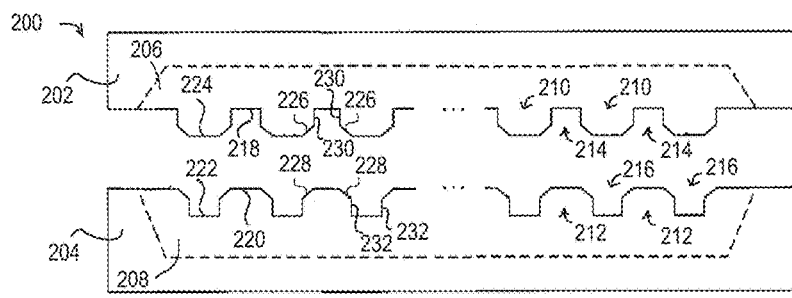
FIG. 2 illustrates a block diagram depicting a cross-sectional view of an example mold chase used to form the package body in FIG. 1.

FIG. 2 illustrates a cross-sectional view of an example mold chase 200 used to form the package body 114 in FIG. 1. Mold chase 200 is shown in an open position for packaging a semiconductor die on a lead frame. The mold chase 200 includes first and second toothed mold clamps 202 and 204. The first (or top) mold clamp 202 has a plurality of teeth 210, a corresponding plurality of recesses 214 located between the teeth 210, and an open cavity 206 located in a center of the first mold clamp 202. The second (or bottom) mold clamp 204 also has a plurality of teeth 212, a corresponding plurality of recesses 216 located between the teeth 212, and an open cavity 208 located in a center of the second mold clamp 204. The second mold clamp 204 is in facing arrangement with the first mold clamp 202 where the teeth 210 and 212 are offset, such that the teeth 210 of the first mold clamp 202 mate with (or are aligned with) corresponding recesses 216 of the second mold clamp 204, and the teeth 212 of the second mold clamp 204 mate with (or are aligned with) corresponding recesses 214 of the first mold clamp 202.

In the embodiment shown, each recess 214 of the first mold clamp 202 has a major surface 218 (or recess surface 218), where each tooth 210 extends from surface 218 out to a tooth surface 224. Each recess 216 of the second mold clamp 204 has a major surface 222 (or recess surface 222), where each tooth 212 extends from surface 222 out to a tooth surface 220. Each recess 214 has side walls 230, which are also side walls of each tooth 210, and each recess 216 has side walls 232, which are also side walls of each tooth 212. In the embodiment shown, chamfered edges 226 join tooth surfaces 224 with sidewalls 230, and chamfered edges 228 join tooth surfaces 220 with side walls 232, although different types of edges may be used in other example mold chases.

During the encapsulation process, the lead frame is placed within the mold chase 200 and the first and second mold clamps 202 and 204 of the mold chase 200 are then closed. When the mold chase 200 is closed, chamfered edges 226 and 228 are in (direct) contact with one another. However, tooth surfaces 220 and 224 do not contact recess surfaces 218 and 222, which leaves recesses 214 and 216 open for holding the leads 104 of the lead frame. Uncured molding compound (also referred to as encapsulation material) can then be injected into the closed mold chase 200 to fill the mold cavity formed by cavities 206 and 208 around the lead frame, which is cured to form the package body 114 around the lead frame.

Figure 3:
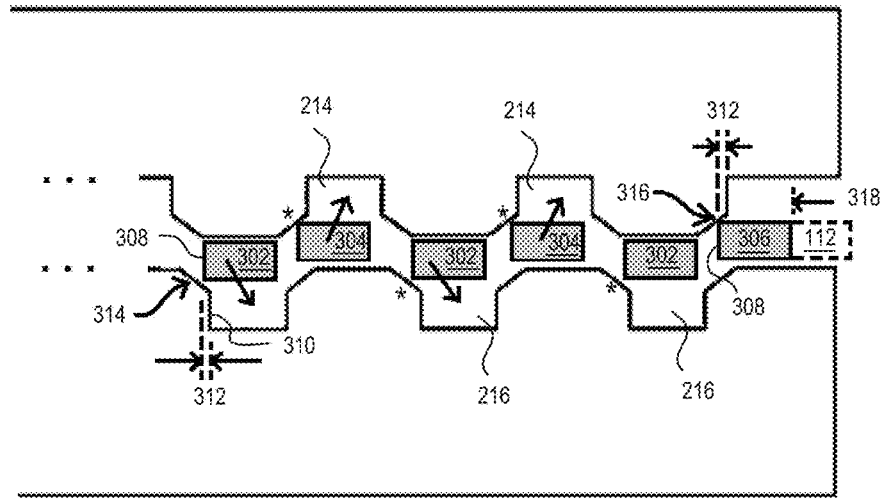
FIG. 3 and FIG. 4 illustrate block diagrams depicting various views of an example encapsulation process to form the package body in FIG. 1 that is implemented by the mold chase of FIG. 2.
Figure 4:
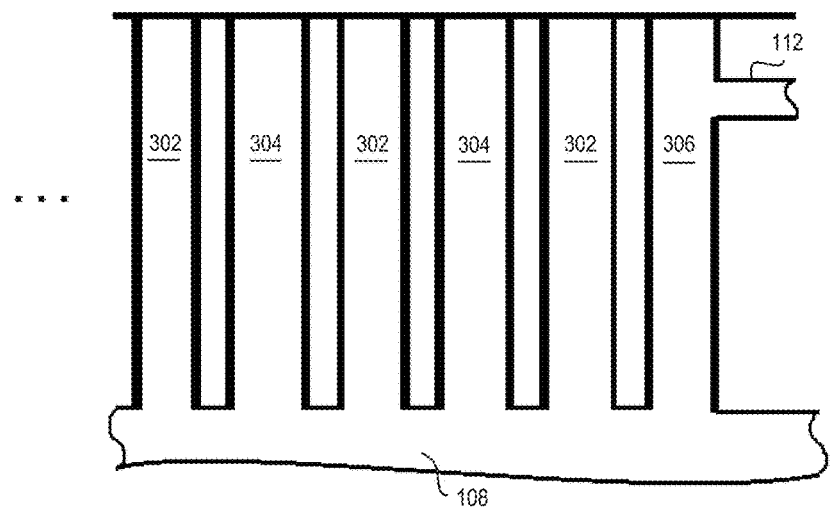

FIG. 3 illustrates a cross-sectional view of a portion of the mold chase 200 as it is being closed around the lead frame. FIG. 4 illustrates a top-down view of the active leads extending from the outer edge of the mold chase, where the leads shown in the top-down view of FIG. 4 are aligned with the leads shown in the cross-sectional view of FIG. 3.

As the mold chase 200 is closed, the teeth of the mold chase 200 guide the active leads of the lead frame to respective recesses 214 and 216, in an alternating manner. As shown, recesses 214 lie in a first plane and are referred to as top recesses 214, and recesses 216 lie in a second plane below the first plane and are referred to as bottom recesses 216. One set of active leads 304 are pushed upward (in the vertical direction relative to FIG. 3) into top recesses 214 and the remaining (alternating) set of active leads 302 are pushed downward (in the vertical direction relative to FIG. 3) into bottom recesses 216. As a result, the active leads of the lead frame are bent into two parallel planes or rows of leads in an alternating manner when the mold chase 200 is closed.

Misalignment of the active leads to the recesses of the mold chase 200 may occur during the encapsulation process. As shown in FIG. 3, each side wall 308 of the active leads is misaligned or offset from a corresponding recess side wall 310 by a misalignment width 312. As the mold chase 200 closes, each active lead makes contact with an edge of a tooth of the mold chase 200, such as at contact point 314 on a chamfered edge (which is also illustrated as an asterisk at each contact point 314). Typically, the active leads 302 and 304 of the lead frame have enough flexibility that they are able to be adjusted or shifted in a sideways manner (in the horizontal direction relative to FIG. 3) into their corresponding recess as the mold chase 200 closes. This side-to-side adjustment during the vertical movement of the leads 302 and 304 into their corresponding recesses is illustrated as diagonal arrows.

However, the neighboring active lead 306 that is connected to a die pad connection structure 110 by tie bar 112 (such as the first or last active lead in a row of active leads) has much less horizontal flexibility than leads 302 and 304 and cannot be adjusted in a side-to-side manner, due to the die pad connection structure 110 being much less flexible in the horizontal direction. Tie bar 112 is shown in FIG. 3 as a box having a dotted line, indicating that the tie bar 112 is separated from the edge of the mold chase 200, which is further shown in FIG. 4. The die pad connection structure 110 and the tie bar 112 prevent the neighboring active lead 306 from adjusting past the point 318 where the neighboring active lead 306 is attached to the tie bar 112. As the mold chase 200 closes, the neighboring active lead 306 is forced into the corresponding recess while being misaligned with the corresponding recess, which deforms the neighboring active lead 306 at the contact point 316 between the lead 306 and the tooth of the mold chase. For example, a portion of the neighboring active lead 306 along the side wall 308 is often sheared off and forms a burr having a width approximate to the misalignment width 312. This burr may then form an electrical short if it gets trapped between the neighboring active lead 306 and the adjacent active lead 302. This is especially problematic as lead pitch and the spacing between leads grows smaller as technology advances, increasing the risk for electrical shorts from such burrs. It is also noted that the tie bar 112 needs to be cut from the neighboring active lead 306, which may also introduce risk for further deformation of the neighboring active lead 306.

The present disclosure provides for a lead frame that minimizes the occurrence of burrs during semiconductor die packaging. The disclosed lead frame includes a number of dummy leads, one on either end of a row of active leads. Each dummy lead is connected to a neighboring die pad connection structure by a tie bar. Each dummy lead is shorter than the active leads, where the dummy lead does not extend out from the package body of a semiconductor die package, but instead remains outside of the package body. The same encapsulation process using the mold chase of FIG. 2 may be used to form the package body around the disclosed lead frame and bend the same number of active leads of the disclosed lead frame. The active leads maintain flexibility for any misalignment adjustment as the mold chase closes, while the less-flexible dummy leads remain outside of the outer edges of the mold chase, avoiding any deformation of the active leads as the mold chase closes. The dummy leads are removed during the trim and form process after the encapsulation process. Since the tie bar is connected to the dummy lead, no additional cuts are required to remove the tie bar from the active leads, further reducing the risk of deformation of the active leads during the trim and form process.

Example Embodiments

Figure 5:
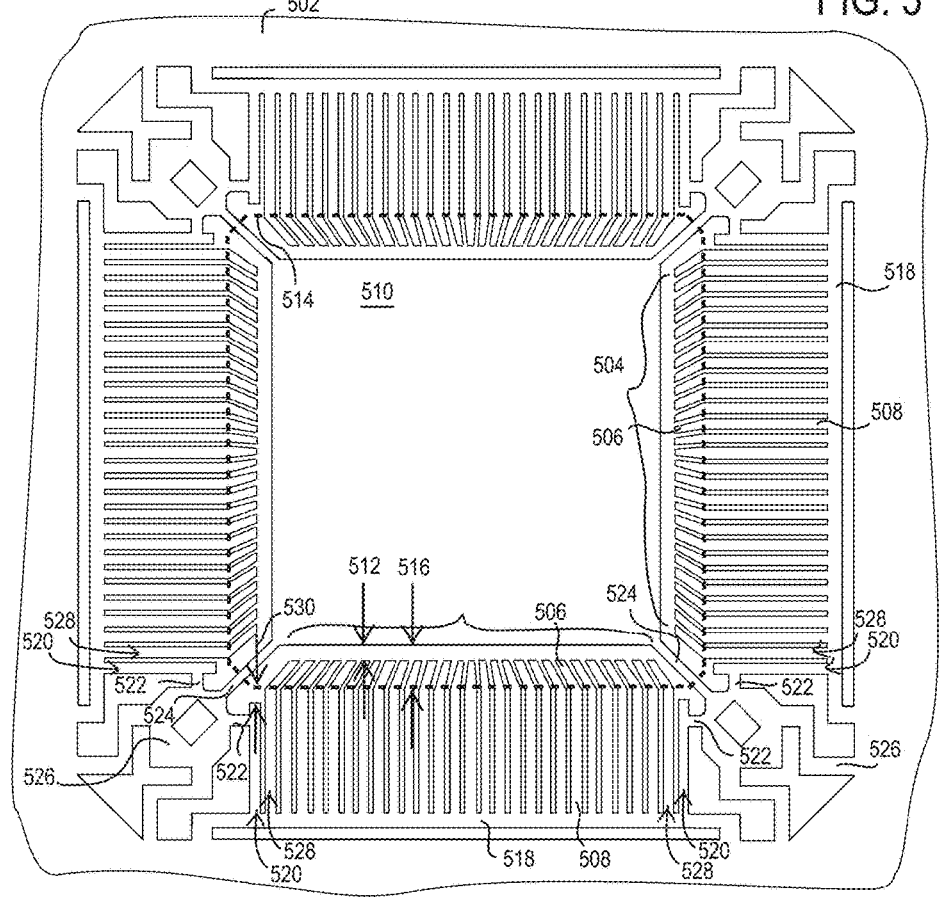
FIG. 5 illustrates a block diagram depicting a top-down view of an example lead frame in which the present disclosure is implemented, according to some embodiments.

FIG. 5 illustrates block diagrams depicting a top-down view of an example lead frame 500 in which the present disclosure is implemented. A semiconductor die package can be formed on lead frame 500, where example steps of such a package fabrication process are discussed below in connection with FIG. 6, FIG. 7, and FIG. 8. The lead frame 500 shown implements a quad flat package (QFP) lead frame design. For example, the QFP lead frame design includes more than one row of leads to increase the number of inputs and outputs (I/Os) while maintaining the same package size.

The lead frame 500 includes a die pad 510 and a number of active lead fingers 504 that are located close to and project outward from the die pad 510. Each active lead finger 504 includes an inner end 506 that is laterally separated from the die pad 510 by a gap distance 512, and includes an outer end 508 that extends away from the die pad 510. The outer ends 508 of the active lead fingers 504 are attached to a surrounding frame structure 502, which may also include structures to improve flexibility to avoid damaging parts of the lead frame 500. In the embodiment shown, frame structure 502 includes connection bar 518, where the outer ends 508 of the active lead fingers 504 are connected to the connection bar 518.

The active lead fingers 504 do not include a dam bar and are not connected to one another, allowing the active lead fingers 504 freedom to move up-and-down (e.g., into and out of the plane of the drawing page) and in a side-to-side manner (e.g., in the plane of the page). Such movement freedom is important when the lead fingers 504 are later bent in a mold chase like that shown in FIG. 2, where the lead fingers 504 also move to compensate for any misalignment of the lead fingers 504 with the recesses of the mold chase. This freedom in movement avoids deformation of the lead fingers 504, as further discussed below in connection with FIG. 9 and FIG. 10. Put another way, each of the active lead fingers 504 are laterally separated from one another along their entire length, from the inner end 506 to the outer end 508. It is noted that the lead frame 500 of FIG. 5 may include a same number of active lead fingers 504 as the lead frame of FIG. 1 and can be placed in the same mold chase of FIG. 2, without requiring any changes or modification to semiconductor die packaging equipment, as further discussed below.

The die pad 510 is also connected to the surrounding frame structure 502 by a number of die pad connection structures that each include a die pad arm 524 and a connection structure 526. In the embodiment shown, the die pad 510 is centrally located in the lead frame 500 (or centered within the frame structure 502) and is connected to four die pad connection structures, one in each corner of the lead frame 500, with four rows of active lead fingers 504, one row along each side of the die pad 510. In the embodiment shown, each side of the die pad 510 corresponds to a respective side of the lead frame 500. Other embodiments may include different arrangements of the die pad 510 and lead fingers 504, such as fewer rows of lead fingers 504, the die pad connection structures being located on a side rather than in a corner of the lead frame 500, or the die pad 510 being located off-center within the frame structure 502. The die pad 510 is shaped to receive a semiconductor die, which is further discussed below in connection with FIG. 6.

The die pad 510 is laterally surrounded by a package body perimeter 514, which is illustrated with a broken line. The package body perimeter 514 indicates where a corresponding edge of the package body will be formed during encapsulation, which is further discussed below in connection with FIG. 8. The package body perimeter 514 is located laterally around the die pad 510, which is shown as the perimeter 514 being laterally separated from the edges of the die pad 510 by an encapsulation distance 516. The inner ends 506 of the active lead fingers 504 fall within the package body perimeter 514 and form electrical connection contact areas to which a semiconductor die is electrically connected, which is further discussed below in connection with FIG. 7. The outer ends 508 of the active lead fingers 504 fall outside of the package body perimeter 514 and will extend from outer edges of the package body, once the package body is formed during the encapsulation process. After the trim and form process, the outer ends 508 form external electrical connections for the semiconductor die, which is further discussed below in connection with FIG. 11.

Dummy lead fingers 520 are located on either end of each row of active lead fingers 504. Put another way, a dummy lead finger 520 is positioned in parallel next to a neighboring active lead finger 528, which may be either a first (or initial) active lead finger or a last (or a terminal) active lead finger of a row of active lead fingers 504. It is noted that the term "neighboring" as used herein means "laterally and immediately adjacent" (e.g., positioned next to and without an intervening object). The dummy lead fingers 520 are separated from and are not connected to the neighboring active lead finger 528 or to the row of active lead fingers 504. Put another way, each dummy lead finger 520 is laterally separated from the neighboring active lead finger 528 along the entire length of the dummy lead finger 520. The dummy lead fingers 520 are shorter than the active lead fingers 504 and fall outside of the package body perimeter 514, where an end of each dummy lead finger 520 is separated from the package body perimeter 514 by a gap distance 530. An example value of the gap distance 530 is 40 microns, and may also vary within a range between 20 to 50 microns. The dummy lead fingers 520 are further discussed in connection with FIG. 8.

The connection structures 526 are attached to respective dummy lead fingers 520 by a respective tie bar 522, which increases stability (e.g., by reducing flexibility) of the connection structures 526 and the die pad 510. In the embodiment shown, each connection structure 526 (e.g., in a corner) is connected to a first dummy lead finger 520 that neighbors a horizontal row of active lead fingers 504 (e.g., on a first side of the die pad 510 or lead frame 500) and a second dummy lead finger 520 that neighbors a vertical row of active lead fingers 504 (e.g., on a second side that is perpendicular to the first side of the die pad 510 or lead frame 500). Put another way, each row of active lead fingers 504 has a first neighboring dummy lead finger 520 that has a tie bar 522 connected to a first connection structure 526 (e.g., at a first corner) and a second neighboring dummy lead finger 520 that has a tie bar 522 connected to a second connection structure 526 (e.g., at a second corner).

The lead frame 500, including the frame structure 502, die pad 510, active lead fingers 504, connection bar 518, dummy lead fingers 520, die pad arm 524, and connection structures 526, are formed from an electrically conductive material, examples of which include but are not limited to copper, nickel, or an alloy thereof. Electrical connection contact areas on the lead frame 500 (such as on the inner ends 506 for electrical connections made to a die or on the outer ends 508 for external electrical connections) may also be coated with an electrically conductive material, examples of which include nickel, gold, copper, aluminum, or other suitable conductive metal or alloy composed of one or more suitable conductive metals.

Figure 6:
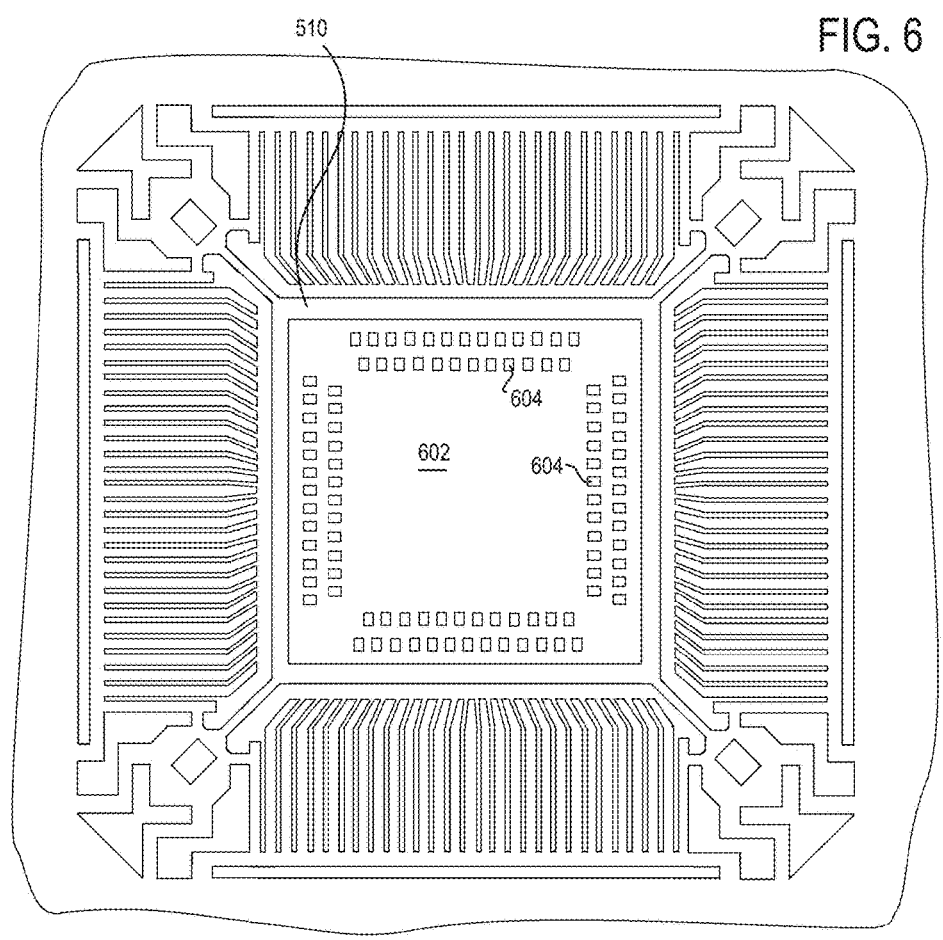
FIG. 6, FIG. 7, and FIG. 8 illustrate block diagrams depicting top-down views of various steps of an example semiconductor die package fabrication process using the lead frame of FIG. 5, according to some embodiments.

FIG. 6 illustrates a top-down view of the lead frame 500 after a semiconductor die 602 is attached to the die pad 510 of lead frame 500. In the embodiment shown, a back side of the semiconductor die 602 is attached to a top surface of die pad 510 using a die attach material that has sufficient adhesive strength to withstand the ultrasonic or thermosonic forces present during wire bonding or a similar electrical interconnection formation process discussed below in connection with FIG. 7. A front side or active side of the semiconductor die 602 includes a number of contact pads 604 (or bond pads 604) that provide connections to internal active circuitry of the semiconductor die 602. In the embodiment shown, the contact pads 604 are arranged in rows, but may be in any arrangement. The semiconductor die 602 may have a size ranging from 1.5 mm×1.5 mm to 12 mm×12 mm, and may have a thickness ranging from 6 mils to 21 mils. The contact pads 604 are formed from an electrically conductive material, examples of which include but are not limited to nickel, gold, copper, aluminum, or other suitable conductive metal or alloy composed of one or more suitable conductive metals. Examples of die attach material include but are not limited to polymer adhesives, epoxies, solders, pastes, films, tailored die cut tapes, and the like. Thermal interface material (TIM) may also be used as the die attach material, which is heat conductive, allowing die pad 510 to act as a heat sink for die 602, in some embodiments.

The semiconductor die 602 may be singulated from a semiconductor wafer, which can be any semiconductor material or combinations of materials, such as gallium arsenide, silicon germanium, silicon-on-insulator (SOI), silicon, monocrystalline silicon, the like, and combinations of the above. The active circuitry of the semiconductor die 602 may include integrated circuit components that are active when the die 602 is powered. The active circuitry is formed on the semiconductor wafer using a sequence of numerous process steps applied to semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Examples of integrated circuit components include but are not limited to a processor, memory, logic, analog circuitry, sensor, MEMS (microelectromechanical systems) device, a standalone discrete device such as a resistor, inductor, capacitor, diode, power transistor, and the like. In some embodiments, the active circuitry may be a combination of the integrated circuit components listed above or may be another type of microelectronic device.

Figure 7:
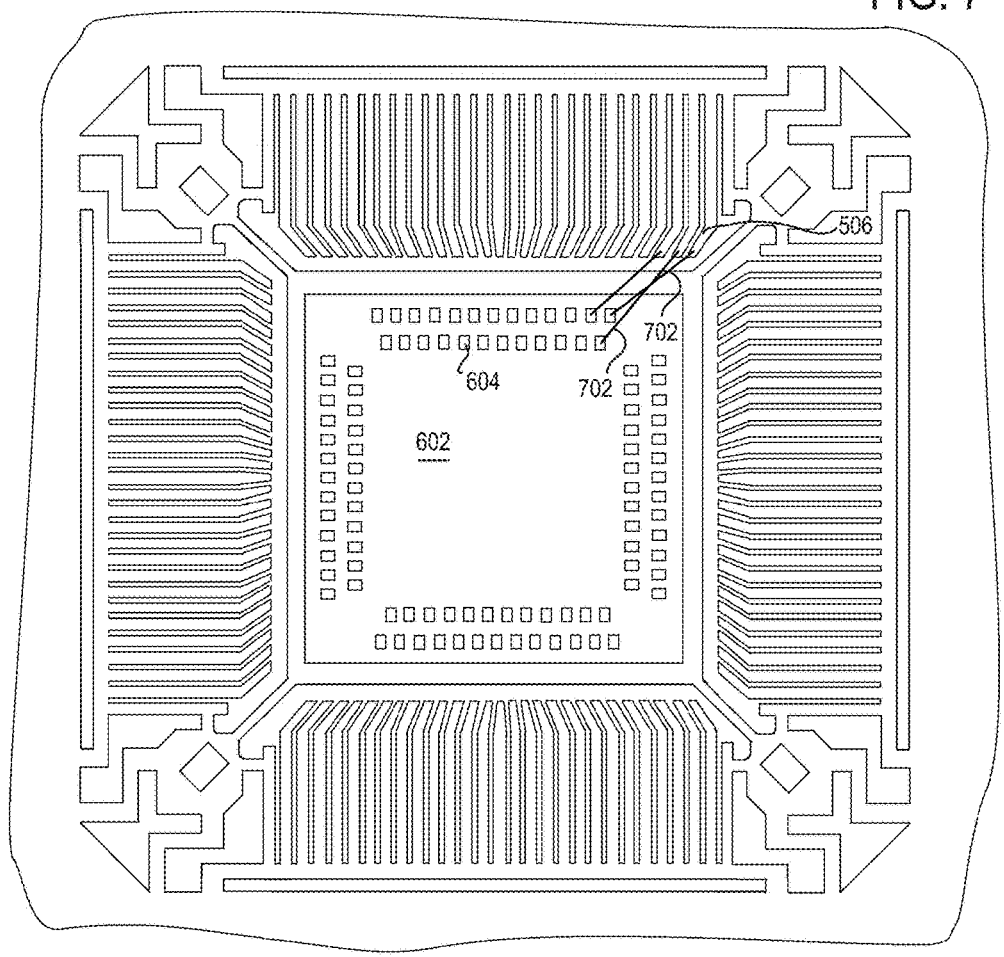

FIG. 7 illustrates a top-down view of the lead frame 500 after electrical connections are made between the semiconductor die 602 and active lead fingers 504 of the lead frame 500. A number of electrical connections 702 are shown, each of which electrically couple a respective contact pad 604 to a respective inner end 506. Each inner end 506 of the active lead fingers 504 includes an electrical connection contact area to which an electrical connection 702 can be bonded or otherwise coupled. The electrical connections 702 may be formed by an electrical coupling process, such as a wire bonding process that forms wire bonds, or another suitable electrical coupling process. The electrical connections 702 are formed from an electrically conductive material, examples of which include but are not limited to nickel, gold, copper, aluminum, or other suitable conductive metal or alloy composed of one or more suitable conductive metals.

It is also noted that inner ends 506 of the active lead fingers 504 may also be referred to as "internal" contacts, and that outer ends 508 of the active lead fingers 504 may also be referred to as "external" contacts. In other words, the inner ends 506 provide contacts that are internal to the resulting semiconductor die package and the outer ends 508 provide contacts that are external to the resulting semiconductor die package, as further discussed below.

Figure 8:
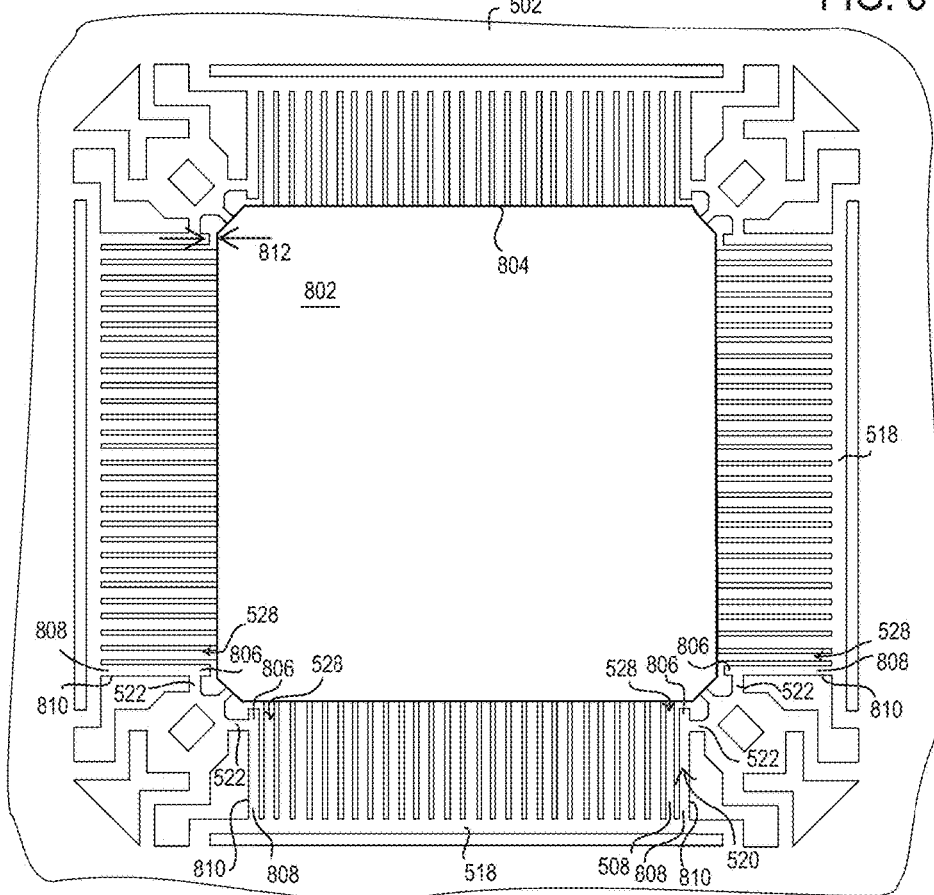

FIG. 8 illustrates a top-down view of the lead frame 500 after a package body 802 is formed around the die pad 510, the semiconductor die 602, the inner ends 506 of active lead fingers 504, and the electrical connections 702 between the die 602 and inner ends 506, which results in the semiconductor die package 800. The package body 802 has a package body outline 804, which follows the outer lateral edges of the package body 802. The package body outline 804 corresponds to the package body perimeter 514 shown in FIG. 5. As shown in FIG. 8, each outer end 508 of the active lead fingers 504 extends from the package body outline 804.

Each dummy lead finger 520 includes a proximal end 806, which is the end of the dummy lead finger 520 closest to the package body outline 804 or package body perimeter 514, and a distal end 808 which is farther away from the package body outline 804 or perimeter 514. Put another way, the proximal ends 806 of the dummy lead fingers 502 are closest to the die pad 510 and the distal ends 808 extend away from the die pad 510. Dummy lead fingers 520 fall outside of the package body outline 804, where the proximal ends 806 are separated from the package body outline 804 by a gap distance 812 that corresponds to the gap distance 530 shown in FIG. 5.

Each dummy lead finger 520 has an outer edge 810, which is the edge of the dummy lead finger 520 facing away from the neighboring row of active lead fingers 504. Each dummy lead finger 520 is connected to a tie bar 522 on the outer edge 810, where the tie bar 522 in turn is connected to a connection structure 526. In the embodiment shown, the tie bar 522 is connected to the dummy lead fingers 520 near the proximal end 806, although the tie bar 522 may be connected to the dummy lead finger 520 elsewhere in other embodiments (e.g., in a center of the dummy lead finger 520 or at the tip of the proximal end 806 of the dummy lead finger 520).

Figure 9:
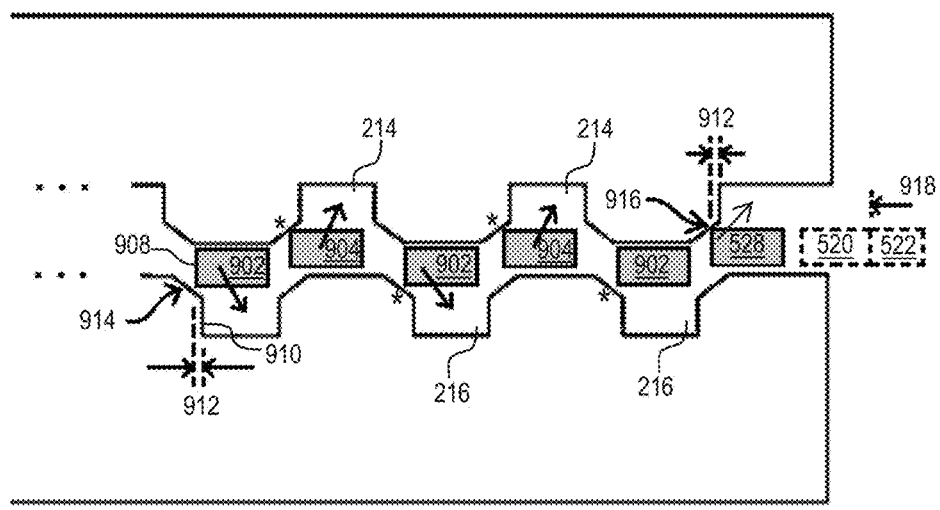
FIG. 9 and FIG. 10 illustrate block diagrams depicting various views of an example encapsulation process to form a package body around the lead frame of FIG. 5 that is implemented by the mold chase of FIG. 2, according to some embodiments.
Figure 10:
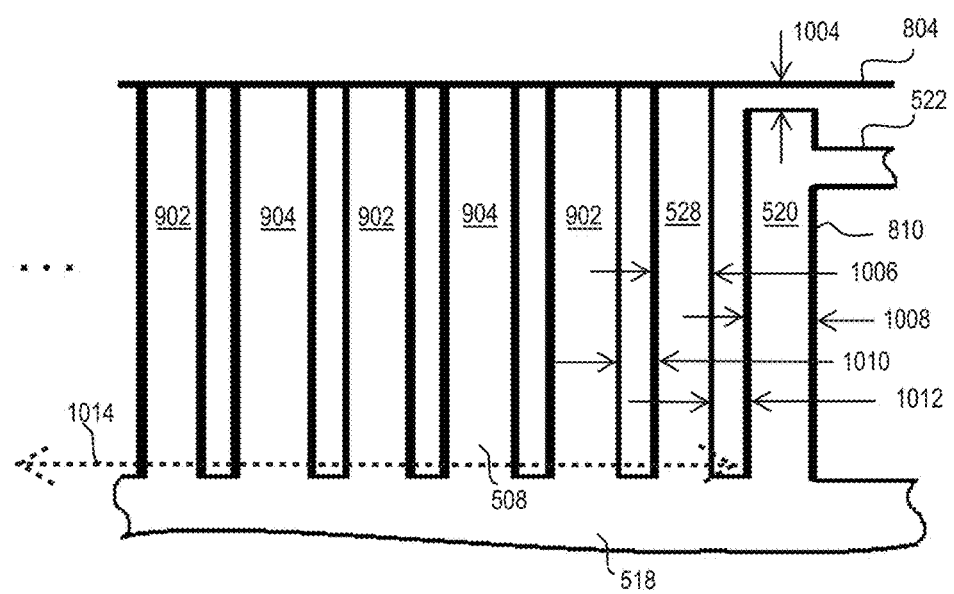

To achieve the semiconductor die package 800, the lead frame 500 as shown in FIG. 7 (including die 602 and electrical connections 702) is placed in the mold chase 200 of FIG. 2 for encapsulation. FIG. 9 illustrates a cross-sectional view of a portion of the mold chase 200 as it is being closed around the lead frame 500. FIG. 10 illustrates a top-down view of the active lead fingers extending from the outer edge of the mold chase (which corresponds to the package body outline 804), where the lead fingers shown in the top-down view of FIG. 9 are aligned with the lead fingers shown in the cross-sectional view of FIG. 10. As shown, the proximal end of the dummy lead finger 520 is separated from the outer edge of the mold chase 200 by a gap distance 1004 (which corresponds to gap distance 812), and extends in the same direction of the active lead fingers.

As the mold chase 200 is closed, the teeth of the mold chase 200 guide the active lead fingers of the lead frame 500 to respective recesses 214 and 216, in an alternating manner. As shown, recesses 214 lie in a first plane and are referred to as top recesses 214, and recesses 216 lie in a second plane below the first plane and are referred to as bottom recesses 216. One set of active lead fingers 904 are pushed upward (in the vertical direction relative to FIG. 9) into top recesses 214 and the remaining (alternating) set of active lead fingers 902 are pushed downward (in the vertical direction relative to FIG. 9) into bottom recesses 216. As a result, the active lead fingers of the lead frame 500 are bent into two parallel planes or rows of leads when the mold chase 200 is closed.

Misalignment of the active lead fingers to the recesses of the mold chase 200 may occur during the encapsulation process. As shown in FIG. 9, each side wall 908 of the active lead fingers is misaligned or offset from a corresponding recess side wall 910 by a misalignment width 912. As the mold chase 200 closes, each active lead makes contact with an edge of a tooth of the mold chase 200, such as at contact point 914 on a chamfered edge (which is also illustrated as an asterisk at each contact point 914). The active lead fingers 902 and 904 of the lead frame 500 have enough flexibility that they are able to be adjusted or shifted in a side-to-side manner (in the horizontal direction relative to FIG. 9) into their corresponding recess as the mold chase 200 closes. This side-to-side adjustment during the vertical movement of the leads 902 and 904 into their corresponding recesses is illustrated as diagonal arrows.

The dummy lead finger 520 connected to a die pad connection structure 526 by tie bar 522 has much less horizontal flexibility than the active lead fingers 902 and 904 and 528 and cannot be adjusted in a side-to-side manner, due to the die pad connection structure 526 being much less flexible in the horizontal direction. Dummy lead finger 520 and tie bar 522 are shown in FIG. 9 as boxes having a dotted line, indicating that the dummy lead finger 520 and tie bar 522 are separated from the edge of the mold chase 200, which is further shown in FIG. 10. The die pad connection structure 526 and the tie bar 522 prevent the dummy lead finger 520 from adjusting past the point 918 where the dummy lead finger 520 is attached to the tie bar 522.

However, since the neighboring active lead finger 528 (which may be the first or the last active lead finger in the row of active lead fingers) is not connected to tie bar 522, neighboring active lead finger 528 also has enough flexibility to be adjusted or shifted in a side-to-side manner into its corresponding recess as the mold chase 200 closes.

In some embodiments, the width 1008 of the dummy lead fingers 520 corresponds to the width 1006 of the active lead fingers, providing a uniform width for all lead fingers on the lead frame 500. In other embodiments, a different width 1008 for the dummy lead fingers may be used. In some embodiments, the spacing 1012 between the dummy lead finger 520 and the neighboring active lead finger 528 corresponds to the spacing 1010 between each of the active lead fingers, providing a uniform spacing for all lead fingers on the lead frame 500. In other embodiments, a different spacing 1012 for the dummy lead fingers may be used.

In some embodiments, the die pad 510 and the active lead fingers 902, 904, 528, and dummy lead fingers 520 all lie in a same plane before a semiconductor die package is built on the lead frame 500. After a semiconductor die package is built on the lead frame 500, the lead fingers 504 may be bent so that at least some of the outer ends 508 of active lead fingers 902, 904, and 528 lie in a different plane than the die pad 510.

Once the mold chase 200 is closed and the active lead fingers 902, 904, 528 are bent into two parallel rows in an alternating manner, an uncured encapsulant material is injected into the mold cavity formed by the top and bottom clamps of the mold chase 200, which surrounds the die pad 510, the semiconductor die 602, inner ends 506 of the active lead fingers, and electrical connections 702, leaving the outer ends 508 of the active lead fingers exposed (e.g., free of molding compound). The encapsulant material is then cured to form the package body 802, which produces a semiconductor die package 800.

In some embodiments, the encapsulant material is a molding compound based on a biphenyl type or multi-aromatic type epoxy resin, but other types of encapsulating materials may be used in other embodiments. The encapsulant material is in liquid form or has a suitable viscosity that allows the encapsulant material to be injected into the mold cavity of the mold chase 200, and is cured (e.g., by heat) to solidify the encapsulant material into the package body 802.

The lead frame 500 may be part of an array of lead frames, where the semiconductor die package 800 built on lead frame 500 may be singulated from the array of lead frames by a trim and form process, which cuts or removes various lead frame support structures used to hold the active lead fingers in place. For example, an example cut 1014 shown in FIG. 10 may separate or detach the outer ends 508 from the frame structure 502, such as by cutting the outer ends 508 from connection bar 518. The dummy lead fingers 520 and tie bars 522 are also removed during the trim and form process. Since the dummy lead fingers 520 are external to the package body 802 (e.g., do not extend through a side of the package body 802), removal of the dummy lead fingers 520 should not further damage the package body 802 beyond what damage may normally occur during the trim and form process.

Figure 11:
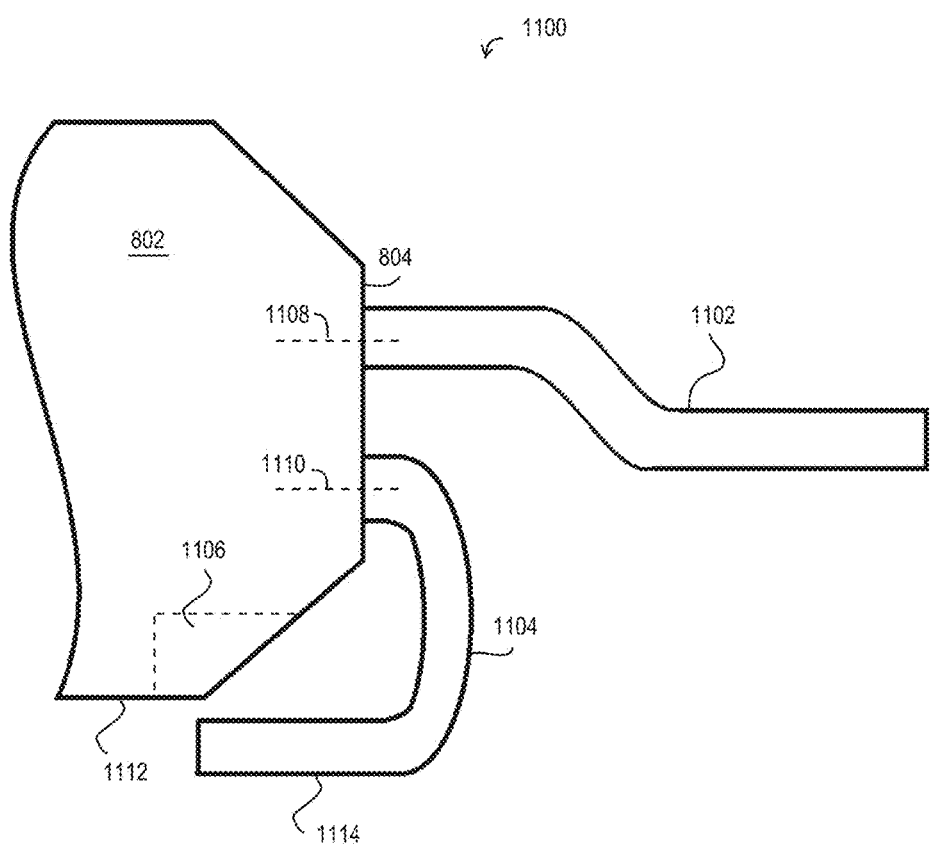
FIG. 11 illustrates a block diagram depicting a cross-sectional view of an example semiconductor die package built on the lead frame of FIG. 5, according to some embodiments.

The trim and form process often includes bending the outer ends of the active lead fingers into shapes to allow for attachment to a printed circuit board (PCB) or other suitable chip carrier. FIG. 11 illustrates a cross-sectional view of an example singulated semiconductor die package 1100 built on the lead frame 500 of FIG. 5.

As discussed above, the active lead fingers are bent during the encapsulation process into two parallel planes or rows in an alternating manner, where the outer ends of the active lead fingers are shown extending from an outer edge or outline 804 of the package body 802. A first set of active lead fingers are bent into a first plane 1108 (also referred to as a top row of active lead fingers 1102) and a second set of active lead fingers are bent into a second plane 1110 (also referred to as a bottom row of active lead fingers 1104), where the second plane 1110 is parallel to and below the first plane 1108. In some embodiments, the die pad 510 is in a different plane than the first and second planes 1108 and 1110. In other embodiments, the die pad 510 is in a same plane as one of the first and second planes 1108 and 1110.

In the embodiment shown, the top row of active lead fingers 1102 are bent into a gull-wing shape, while the bottom row of active lead fingers 1104 are bent into a J-shape. In some embodiments, a respective slot 1106 may also be formed in the bottom surface 1112 of the package body 802 for each J-shaped lead finger 1104, allowing a bottom surface 1114 of each J-shaped lead finger 1104 to be flush with the bottom surface 1112 of the package body 802. The alternating active lead fingers 1102 and 1104 provide external electrical connections to the semiconductor die 602 within the semiconductor die package 1100, which may be connected to a PCB or other suitable chip carrier (e.g., the active lead fingers to contacts on the PCB).

By now it should be appreciated that there has been provided a lead frame that minimizes the occurrence of burrs during fabrication of a semiconductor die package. The disclosed lead frame includes a number of dummy leads, one on either end of a row of active leads. Each dummy lead is connected to a neighboring die pad connection structure by a tie bar. Each dummy lead is shorter than the active leads, where the dummy lead does not extend out from the package body of a semiconductor die package, but instead remains outside of the package body. The dummy leads are removed during the trim and form process after the encapsulation process.

In one embodiment of the present disclosure, a lead frame for a packaged semiconductor device is provided, which includes: a die pad; a first row of active lead fingers having inner ends separated from the die pad by a first gap distance and outer ends positioned away from the die pad, wherein each of the active lead fingers are laterally separated from one another along their entire length; a package body perimeter that indicates placement of a package body of the packaged semiconductor device, wherein the package body perimeter is located laterally around the die pad, and wherein the inner ends fall within the package body perimeter and the outer ends fall outside of the package body perimeter; a first dummy lead finger positioned in parallel next to an initial active lead finger of the first row of active lead fingers, wherein the first dummy lead finger and the initial active lead finger are laterally separated from one another along their entire length, and wherein the first dummy lead finger is separated from the package body perimeter by a second gap distance; and a first tie bar connected to an outside edge of the first dummy lead finger.

One aspect of the above embodiment provides that the lead frame further includes: a second dummy lead finger positioned in parallel next to a last active lead finger of the first row of active lead fingers, wherein the second dummy lead finger and the last active lead finger are laterally separated from one another along their entire length, and wherein the second dummy lead finger is separated from the package body perimeter by the second gap distance.

A further aspect of the above embodiment provides that the lead frame further includes: a second tie bar having one end connected to an outside edge of the second dummy lead finger.

Another aspect of the above embodiment provides that the lead frame further includes: a frame structure surrounding the die pad and the first row of active lead fingers, wherein the die pad is connected to the frame structure by at least a first connection arm structure, and wherein the outer ends of the first row of lead fingers are each connected to the frame structure.

A further aspect of the above embodiment provides that a distal end of the first dummy lead finger is connected to the frame structure.

A still further aspect of the above embodiment provides that the first tie bar is connected between the first connection arm structure and the outside edge of a proximal end of the first dummy lead finger, and the proximal end is separated from the package body perimeter by the second gap distance.

Another aspect of the above embodiment provides that the lead frame further includes: a second row of active lead fingers having inner ends separated from another side of the die pad by the first gap distance and outer ends positioned away from the die pad, wherein each of the second row of active lead fingers are laterally separated from one another along their entire length.

A further aspect of the above embodiment provides that the lead frame further includes: third and fourth dummy lead fingers respectively positioned in parallel next to initial and last active lead fingers of the second row of active lead fingers, wherein the third dummy lead finger and the initial active lead finger are laterally separated from one another along their entire length, and the fourth dummy lead finger and the last active lead finger are laterally separated from one another along their entire length.

A still further aspect of the above embodiment provides that the third and fourth dummy lead fingers are separated from the package body perimeter by the second gap distance.

In another embodiment of the present disclosure, a lead frame for a packaged semiconductor device is provided, which includes: a die pad; a first row of active lead fingers having inner ends separated from a first side of the die pad by a first gap distance and outer ends positioned away from the die pad, wherein each of the active lead fingers are laterally separated from one another along their entire length; a frame structure surrounding the die pad and the first row of active lead fingers, wherein the die pad is connected to the frame structure by at least a first connection arm structure, and wherein the outer ends of the first row of lead fingers are each connected to the frame structure; a first dummy lead finger positioned in parallel next to an initial active lead finger of the first row of active lead fingers, wherein the first dummy lead finger and the initial active lead finger are laterally separated from one another along their entire length, and wherein a distal end of the first dummy lead finger is connected to the frame structure; and a first tie bar having one end connected to an outside edge of a proximal end of the first dummy lead finger and another end connected to the first connection arm structure.

One aspect of the above embodiment provides that the lead frame further includes: a second dummy lead finger positioned in parallel next to a last active lead finger of the first row of active lead fingers, wherein the second dummy lead finger and the last active lead finger are laterally separated from one another along their entire length, and wherein a distal end of the second dummy lead finger is connected to the frame structure.

A further aspect of the above embodiment provides that the lead frame further includes: a second tie bar having one end connected to an outside edge of a proximal end of the second dummy lead finger and another end connected to a second connection arm structure that further connects the die pad to the frame structure.

Another aspect of the above embodiment provides that the lead frame further includes: a second row of active lead fingers having inner ends separated from a second side of the die pad by the first gap distance and outer ends positioned away from the die pad, wherein each of the second row of active lead fingers are laterally separated from one another along their entire length.

A further aspect of the above embodiment provides that the lead frame further includes: third and fourth dummy lead fingers respectively positioned in parallel next to initial and last active lead fingers of the second row of active lead fingers, wherein the third dummy lead finger and the initial active lead finger are laterally separated from one another along their entire length, and the fourth dummy lead finger and the last active lead finger are laterally separated from one another along their entire length.

Another aspect of the above embodiment provides that the lead frame further includes: a package body perimeter that indicates placement of a package body of the packaged semiconductor device, wherein the package body perimeter is located laterally around the die pad, and wherein the inner ends of the first row of active lead fingers fall within the package body perimeter, and wherein the outer ends of the first row of active lead fingers fall outside of the package body perimeter.

A further aspect of the above embodiment provides that the proximal end of the first dummy lead finger is separated from the package body perimeter by a second gap distance.

In another embodiment of the present disclosure, a method for building a packaged semiconductor device on a lead frame is provided, the method including: providing an electrically conductive lead frame that includes: a die pad, a row of active lead fingers that extend away from the die pad, wherein each of the active lead fingers are laterally separated from one another along their entire length, a first dummy lead finger positioned in parallel next to a first active lead finger at one end of the row of active lead fingers, and a second dummy lead finger positioned in parallel next to a second active lead finger at another end of the row of active lead fingers, wherein the first and second dummy lead fingers are laterally separated from the first and second active lead fingers along their entire length; attaching a semiconductor die to the die pad; electrically coupling contact pads on the semiconductor die with respective internal contact ends of the row of active lead fingers; and forming a package body that encompasses the semiconductor die and the respective internal contact ends, wherein external contact ends of the row of active lead fingers extend from a package body outline of the package body, and wherein the first and second dummy lead fingers are separated from the package body outline by a gap distance.

One aspect of the above embodiment provides that the method further includes: the forming the package body includes: placing the lead frame in a mold chase having two planar rows of recesses, and bending, by closing the mold chase, the external contact ends of the row of active lead fingers into first and second sets of lead fingers in an alternating arrangement, wherein the first set of lead fingers are aligned to a first plane and the second set of lead fingers are aligned to a second plane that is parallel to the first plane, and injecting encapsulation material into a mold cavity of the mold chase to form the package body.

A further aspect of the above embodiment provides that the method further includes: bending the first set of lead fingers into gull wing shaped leads; and bending the second set of lead fingers into J-shaped leads.

Another aspect of the above embodiment provides that the method further includes: detaching the external contact ends of the row of active lead fingers from a surrounding frame structure, which includes removing the first and second dummy lead fingers from the packaged semiconductor device.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein, the terms "substantial" and "substantially" mean sufficient to achieve the stated purpose or value in a practical manner, taking into account any minor imperfections or deviations, if any, that arise from usual and expected process abnormalities that may occur during wafer fabrication or semiconductor die packaging, which are not significant for the stated purpose or value.

Although the invention is described herein with reference to specific embodiments, various modifications and changes can be made without departing from the scope of the present invention as set forth in the claims below. For example, additional or fewer rows of active lead fingers or die pad connection structures may be implemented in FIG. 1. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A lead frame for a packaged semiconductor device, the lead frame comprising:
    a die pad;
    a first row of active lead fingers having inner ends separated from the die pad by a first gap distance and outer ends positioned away from the die pad, wherein each of the active lead fingers are laterally separated from one another along their entire length;
    a package body perimeter that indicates placement of a package body of the packaged semiconductor device, wherein the package body perimeter is located laterally around the die pad, and wherein the inner ends fall within the package body perimeter and the outer ends fall outside of the package body perimeter;
    a first dummy lead finger positioned in parallel next to an initial active lead finger of the first row of active lead fingers, wherein the first dummy lead finger and the initial active lead finger are laterally separated from one another along their entire length, and wherein the first dummy lead finger is separated from the package body perimeter by a second gap distance and is located outside of the package body perimeter; and
    a first tie bar connected to an outside edge of the first dummy lead finger.

2. The lead frame of claim 1, further comprising:
    a second dummy lead finger positioned in parallel next to a last active lead finger of the first row of active lead fingers, wherein the second dummy lead finger and the last active lead finger are laterally separated from one another along their entire length, and wherein the second dummy lead finger is separated from the package body perimeter by the second gap distance.

3. The lead frame of claim 2, further comprising:
a second tie bar having one end connected to an outside edge of the second dummy lead finger.

4. The lead frame of claim 1, further comprising:
a frame structure surrounding the die pad and the first row of active lead fingers, wherein the die pad is connected to the frame structure by at least a first connection arm structure, and wherein the outer ends of the first row of lead fingers are each connected to the frame structure.

5. The lead frame of claim 4, wherein
a distal end of the first dummy lead finger is connected to the frame structure.

6. The lead frame of claim 5, wherein
the first tie bar is connected between the first connection arm structure and the outside edge of a proximal end of the first dummy lead finger, and
the proximal end is separated from the package body perimeter by the second gap distance.

7. The lead frame of claim 1, further comprising:
a second row of active lead fingers having inner ends separated from another side of the die pad by the first gap distance and outer ends positioned away from the die pad, wherein each of the second row of active lead fingers are laterally separated from one another along their entire length.

8. The lead frame of claim 7, further comprising:
third and fourth dummy lead fingers respectively positioned in parallel next to initial and last active lead fingers of the second row of active lead fingers, wherein the third dummy lead finger and the initial active lead finger are laterally separated from one another along their entire length, and the fourth dummy lead finger and the last active lead finger are laterally separated from one another along their entire length.

9. The lead frame of claim 8, wherein
the third and fourth dummy lead fingers are separated from the package body perimeter by the second gap distance.

10. A lead frame for a packaged semiconductor device, the lead frame comprising:
a die pad;
a first row of active lead fingers having inner ends separated from a first side of the die pad by a first gap distance and outer ends positioned away from the die pad, wherein each of the active lead fingers are laterally separated from one another along their entire length;
a frame structure surrounding the die pad and the first row of active lead fingers, wherein the die pad is connected to the frame structure by at least a first connection arm structure, and wherein the outer ends of the first row of lead fingers are each connected to the frame structure;
a first dummy lead finger positioned in parallel next to an initial active lead finger of the first row of active lead fingers, wherein the first dummy lead finger and the initial active lead finger are laterally separated from one another along their entire length, and wherein a distal end of the first dummy lead finger is connected to the frame structure; and
a first tie bar having one end connected to an outside edge of a proximal end of the first dummy lead finger and another end connected to the first connection arm structure.

11. The lead frame of claim 10, further comprising:
a second dummy lead finger positioned in parallel next to a last active lead finger of the first row of active lead fingers, wherein the second dummy lead finger and the last active lead finger are laterally separated from one another along their entire length, and wherein a distal end of the second dummy lead finger is connected to the frame structure.

12. The lead frame of claim 11, further comprising:
a second tie bar having one end connected to an outside edge of a proximal end of the second dummy lead finger and another end connected to a second connection arm structure that further connects the die pad to the frame structure.

13. The lead frame of claim 10, further comprising:
a second row of active lead fingers having inner ends separated from a second side of the die pad by the first gap distance and outer ends positioned away from the die pad, wherein each of the second row of active lead fingers are laterally separated from one another along their entire length.

14. The lead frame of claim 13, further comprising:
third and fourth dummy lead fingers respectively positioned in parallel next to initial and last active lead fingers of the second row of active lead fingers, wherein the third dummy lead finger and the initial active lead finger are laterally separated from one another along their entire length, and the fourth dummy lead finger and the last active lead finger are laterally separated from one another along their entire length.

15. The lead frame of claim 10, further comprising:
a package body perimeter that indicates placement of a package body of the packaged semiconductor device, wherein the package body perimeter is located laterally around the die pad, and wherein the inner ends of the first row of active lead fingers fall within the package body perimeter, and wherein the outer ends of the first row of active lead fingers fall outside of the package body perimeter.

16. The lead frame of claim 15, wherein the proximal end of the first dummy lead finger is separated from the package body perimeter by a second gap distance.

17. A method for building a packaged semiconductor device on a lead frame, the method comprising:
providing an electrically conductive lead frame comprising:
a die pad,
a row of active lead fingers that extend away from the die pad, wherein each of the active lead fingers are laterally separated from one another along their entire length,
a first dummy lead finger positioned in parallel next to a first active lead finger at one end of the row of active lead fingers, and a second dummy lead finger positioned in parallel next to a second active lead finger at another end of the row of active lead fingers, wherein the first and second dummy lead fingers are laterally separated from the first and second active lead fingers along their entire length;
attaching a semiconductor die to the die pad;
electrically coupling contact pads on the semiconductor die with respective internal contact ends of the row of active lead fingers; and
forming a package body that encompasses the semiconductor die and the respective internal contact ends, wherein external contact ends of the row of active lead fingers extend from a package body outline of the package body, and wherein the first and second dummy lead fingers are separated from the package body outline by a gap distance and are located outside of the package body.

18. The method of claim 17, further comprising:
the forming the package body comprises:
- placing the lead frame in a mold chase having two planar rows of recesses, and
- bending, by closing the mold chase, the external contact ends of the row of active lead fingers into first and second sets of lead fingers in an alternating arrangement, wherein the first set of lead fingers are aligned to a first plane and the second set of lead fingers are aligned to a second plane that is parallel to the first plane, and
- injecting encapsulation material into a mold cavity of the mold chase to form the package body.

19. The method of claim 18, further comprising:
bending the first set of lead fingers into gull wing shaped leads; and
bending the second set of lead fingers into J-shaped leads.

20. The method of claim 17, further comprising:
detaching the external contact ends of the row of active lead fingers from a surrounding frame structure, which comprises removing the first and second dummy lead fingers from the packaged semiconductor device.

\* \* \* \* \*